United States Patent
Elison et al.

(10) Patent No.: US 9,277,677 B2
(45) Date of Patent: Mar. 1, 2016

(54) COOLING AN ELECTRONIC DEVICE USING A THERMALLY CONDUCTIVE LOOP

(71) Applicant: International Business Machines Corporation, Armonk, NY (US)

(72) Inventors: Bret P. Elison, Rochester, MN (US); Phillip V. Mann, Rochester, MN (US); Arden L. Moore, Cedar Park, TX (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 14/107,121

(22) Filed: Dec. 16, 2013

(65) Prior Publication Data
US 2015/0156923 A1   Jun. 4, 2015

Related U.S. Application Data

(63) Continuation of application No. 14/096,653, filed on Dec. 4, 2013.

(51) Int. Cl.
*H05K 7/20* (2006.01)
(52) U.S. Cl.
CPC .......... *H05K 7/2039* (2013.01); *H05K 7/20409* (2013.01)
(58) Field of Classification Search
CPC .......... H05K 7/20263; H05K 7/20281; H05K 7/20454; G06F 1/20–1/203
See application file for complete search history.

(56) References Cited

U.S. PATENT DOCUMENTS

| | | | |
|---|---|---|---|
| 4,634,854 A * | 1/1987 | Wirick ........................... | 250/216 |
| 6,791,789 B2 | 9/2004 | Rathweg | |
| 7,957,094 B1 | 6/2011 | Liu et al. | |
| 2001/0006453 A1 | 7/2001 | Glorioso et al. | |
| 2004/0207980 A1 | 10/2004 | Kobayashi | |
| 2008/0043371 A1 | 2/2008 | Konshak et al. | |

FOREIGN PATENT DOCUMENTS

| | | |
|---|---|---|
| CN | 201084077 Y | 7/2008 |
| EP | 1429339 A2 | 6/2004 |
| EP | 1721842 B1 | 12/2006 |
| JP | 2000011348 A | 1/2000 |
| WO | 9711462 A1 | 3/1997 |

OTHER PUBLICATIONS

Elison et al, "Electronic Cooling Device," U.S. Appl. No. 14/096,653, filed Dec. 4, 2013.
Iben, I.E.T., et al, "Steady-state Thermal Characteristics of AMR Read/Write Heads Used in Tape Storage Devices," IBM Journal of Research and Development, vol. 47, No. 4, p. 401 (2003), Tape Storage Systems and Technology.

(Continued)

*Primary Examiner* — Zachary M Pape
(74) *Attorney, Agent, or Firm* — Scott S. Dobson; Robert Williams

(57) ABSTRACT

A continuous loop of thermally conductive material is provided with a first portion in frictional contact with a casing of an electronic device and a second portion located within a cooling region. The loop is advanced such that the first portion is located within the cooling region and the second portion is in frictional contact with the casing.

9 Claims, 5 Drawing Sheets

(56) References Cited

OTHER PUBLICATIONS

Van Es, R.A., et al., "Forced Convection Cooling Benchmark Study of a HDD in Various Consumer Electronics Applications," Thermal and Thermomechanical Phenomena in Electronic Systems, 2008, ITHERM 2008, 11th Intersociety Conference on, May 28-31, 2008, vol., No., pp. 31,36 ISSN: 1087-98780, doi: 10.1109/ITHERM.2008.4544250.

Wang, M., et al, "A Comprehensive Study in Thermal Dissipation Assessment of Hard Disk Drive Component," Electronic Materials and Packaging, 2006. EMAP 2006. International Conference on , Vol., No., pp. 1,5, Dec. 11-14, 2006, doi: 10.1109/EMAP.2006.4430612.

* cited by examiner

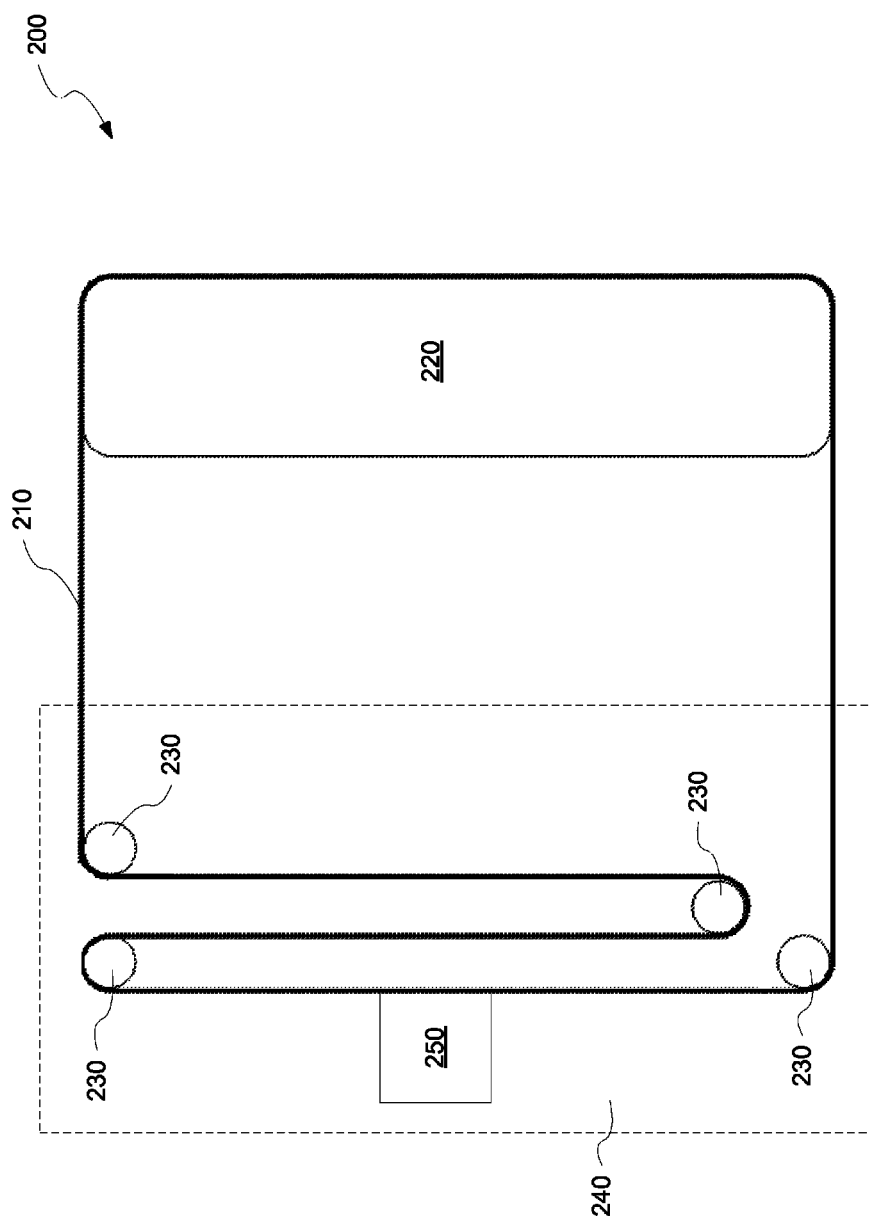

COOLING AN ELECTRONIC DEVICE USING A THERMALLY CONDUCTIVE LOOP

CROSS-REFERENCE TO RELATED APPLICATIONS

This application is a continuation of co-pending U.S. patent application Ser. No. 14/096,653, filed Dec. 4, 2013. The aforementioned related patent application is herein incorporated by reference in its entirety.

BACKGROUND

The present disclosure relates generally to the field of computers and more particularly to cooling of computer components.

Direct access storage devices (DASDs) are increasing in power and as a result are emitting more electromagnetic interference. In order to pass electromagnetic compatibility these DASDs require additional protection which drastically decreases airflow to the DASDs.

SUMMARY

Disclosed herein are embodiments of a method for cooling an electronic device. The method includes providing a continuous loop of thermally conductive material in a first position. A first portion of the loop in the first position is in frictional contact with a casing of the electronic device and a second portion of the loop in the first position is located within a cooling region. The method further includes advancing the loop to a second position. The first portion of the loop in the second position is located within the cooling region and the second portion of the loop in the second position is in frictional contact with the casing of the electronic device.

Also disclosed herein are embodiments of an apparatus for cooling an electronic device. The apparatus includes a thermally conductive material forming a continuous loop which is configured to be partially in frictional contact with a casing of an electronic device and partially located within a cooling region. The apparatus also includes a driving device. The driving device configured to advance portions of the loop between the casing and the cooling region.

BRIEF DESCRIPTION OF THE DRAWINGS

FIG. 2 depicts a second example apparatus for cooling electronic devices.

DETAILED DESCRIPTION

Figure 1A:
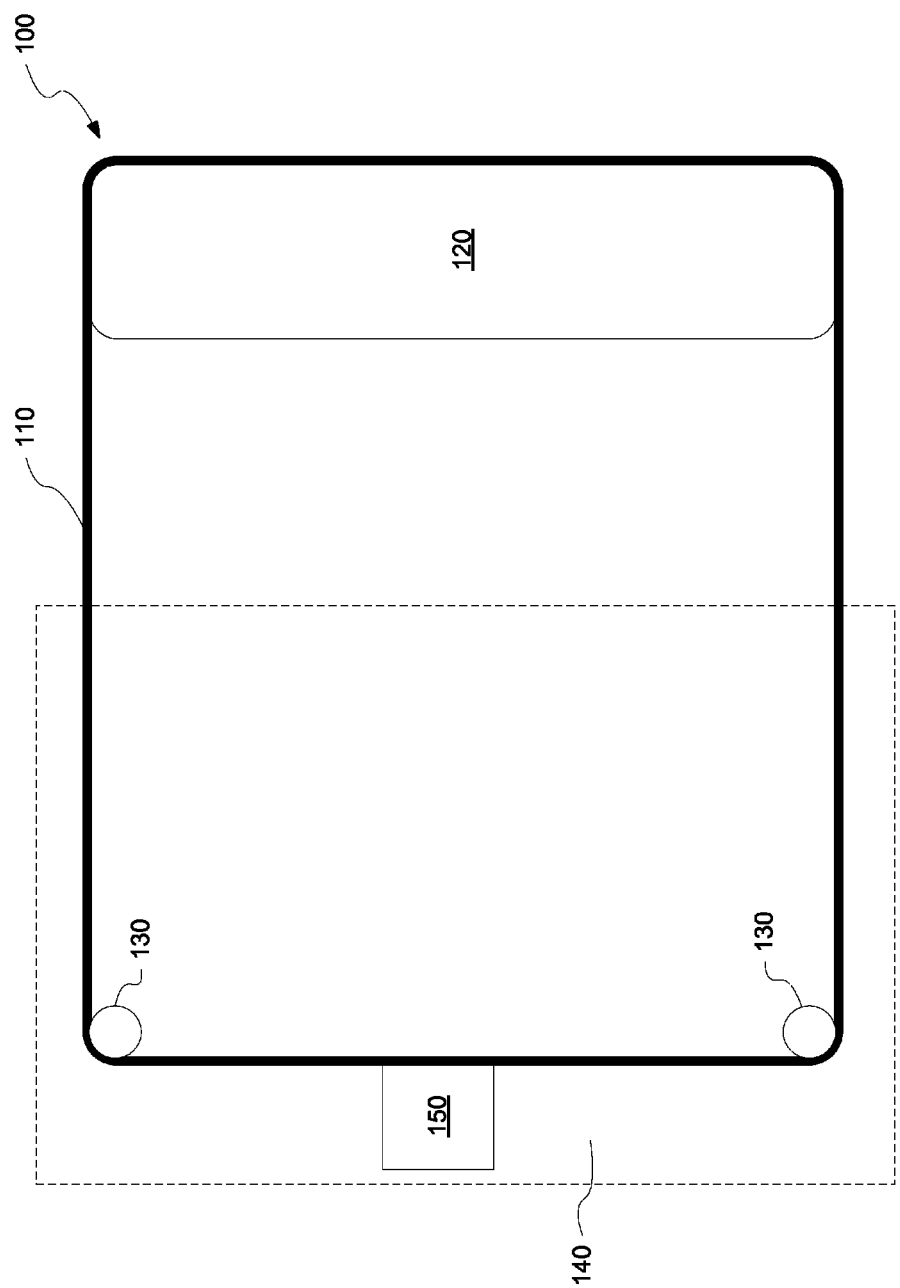
FIG. 1A depicts a side view of an example apparatus for cooling electronic devices.

Embodiments of the current invention may allow for the cooling of an electronic device by sliding a thermally conductive material across the surface of the casing of the electronic device. The electronic device may be a direct access storage device (DASD) or any other electronic device. A flexible thermally conductive material may form a continuous loop. The loop may be partially in frictional contact with the casing of an electronic device and partially located within a cooling region. The loop may be driven such that the portions of the loop move between being in frictional contact with the electronic device and being within the cooling region. Heat may be transferred from the casing of the electronic device to the loop as it moves across the casing of the electronic device and may be dissipated from the loop as it passes through the cooling region. In some embodiments, the loop may slide across the surface of more than one electronic device casing.

The electronic device casing and the loop may be designed to allow good thermal transfer while limiting the amount of frictional heat produced. The casing may provide a low friction surface and may be shaped to allow for sliding the loop across its surface. For example, the casing may have rounded edges to facilitate sliding around the casing. The material pairing between the casing and the loop may be chosen to have a low coefficient of kinetic friction between their surfaces. In one example, the casing surface may be made of polished steel and the loop may be made of copper with the combination having a coefficient of kinetic friction of less than or equal to 0.36.

Several factors may influence the thermal transport of the system such as the force applied between the loop and the casing, the surface area in contact between the loop and the casing, the velocity of the loop across the casing, and the frictional coefficient between the loop and the surface of the casing. A higher applied force between the loop and the casing may result in more heat produced as a result of friction, but may also result in better contact for heat transfer between the loop and the casing. Similarly, a greater surface area in contact may result in more heat produced as a result of friction but may also increase the transfer of heat between the loop and the casing. Additionally, an optimal velocity may exist for sliding the loop across the surface of the casing as both thermal transport and heat produced due to friction may increase with increasing velocity. Further, the frictional coefficient between the loop and the casing may influence the heat produced due to friction. These factors may be adjusted to impact the overall thermal transport effectiveness of the system.

The loop may be supported using any method which allows the loop to be driven across the casing and through the cooling region. In some embodiments, the loop may be held in place by one or more rolling pins. These pins may be placed such that a portion of the loop may pass through the cooling area multiple times as it is driven before returning to contact with the casing.

The loop may be driven using any method. In some embodiments, frictional rollers may drive the loop. The outer surface of the loop may be made rough or may contain a material which has a high coefficient of static friction with the surface of the frictional roller. In some embodiments, the loop may be driven by a gear with teeth which associate with teeth on the outer side of the loop. The loop may be driven continuously in the same direction. The loop may be driven at a constant speed.

The cooling region may be any region which allows portions of the loop to dissipate heat. The system may be designed with the cooling region or an existing system may be adapted to include a cooling region using one or more dedicated slots. In some embodiments the cooling region may be an airflow region with flowing air produced by a fan or other method. In other embodiments, the cooling region may use a liquid cooling method. For example, the cooling region may contain water.

Referring to FIG. 1A, a side view of an example apparatus 100 for cooling electronic devices is depicted. The electronic device may be any electronic device such as a DASD. A loop of flexible thermally conductive material 110 is partially in frictional contact with casing 120 of an electronic device and partially runs through a cooling region 140. Rolling pins 130 may keep loop 110 in place and allow loop 110 to be driven across casing 120 and through cooling region 140. Loop 110 may be driven by a driving device 150.

Loop 110 may be made of any flexible thermally conductive material such as copper. Casing 120 may be made of any material. In some embodiments, loop 110 is made of copper and casing 120 is made of polished steel. These embodiments may allow for a low coefficient of kinetic friction between loop 110 and casing 120. Rolling pins 130 may be made of any material and may rotate as loop 110 is driven. Cooling region 140 may be an airflow region with moving air. The moving air may be produced from a fan or any other method.

Driving device 150 may be any device which may drive portions of the loop across casing 120 and through cooling region 140. Driving device 150 may move loop 110 at a constant velocity. In some embodiments, driving device 150 is a gear with teeth which is rotated. In these embodiments, the outer surface of loop 110 may also contain teeth which interact with the teeth of driving device 150.

Figure 1B:
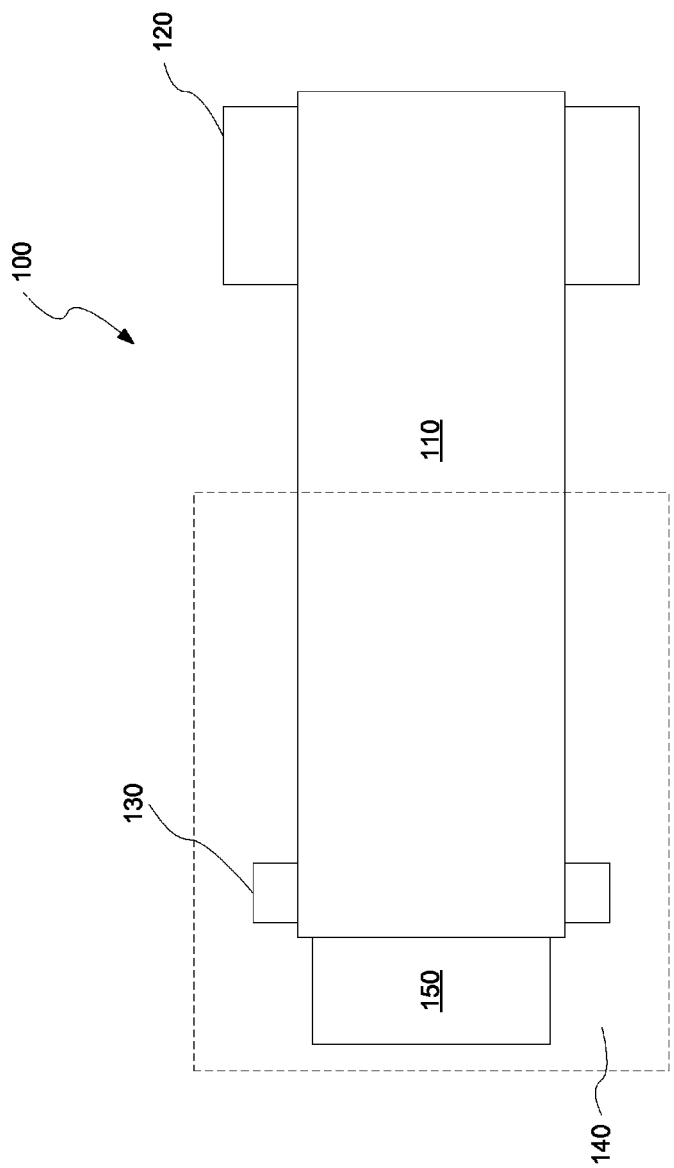
FIG. 1B depicts a top view of an example apparatus for cooling electronic devices.

Referring to FIG. 1B, a top view of example apparatus 100 is depicted. As shown, the top portion of loop 110 is partially in frictional contact with casing 120 and partially within cooling region 140. Loop 110 may be supported by rolling pin 130. Driving device 150 is associated with loop 110 to drive it.

Referring to FIG. 2, a second example apparatus 200 for cooling electronic devices is depicted. Similar to apparatus 100 depicted in FIG. 1A and FIG. 1B, a loop 210 of thermally conductive material is partially in frictional contact with an electronic device casing 220 and partially within a cooling region 240. In this embodiment, there are four rolling pins supporting loop 210. This may allow for the loop to have more material in cooling region 240. A portion of loop 210 may spend a larger amount of time in cooling region 240 as it is driven by driving device 250 and may allow for more cooling of portions of loop 210 after absorbing heat from casing 220.

Figure 3:
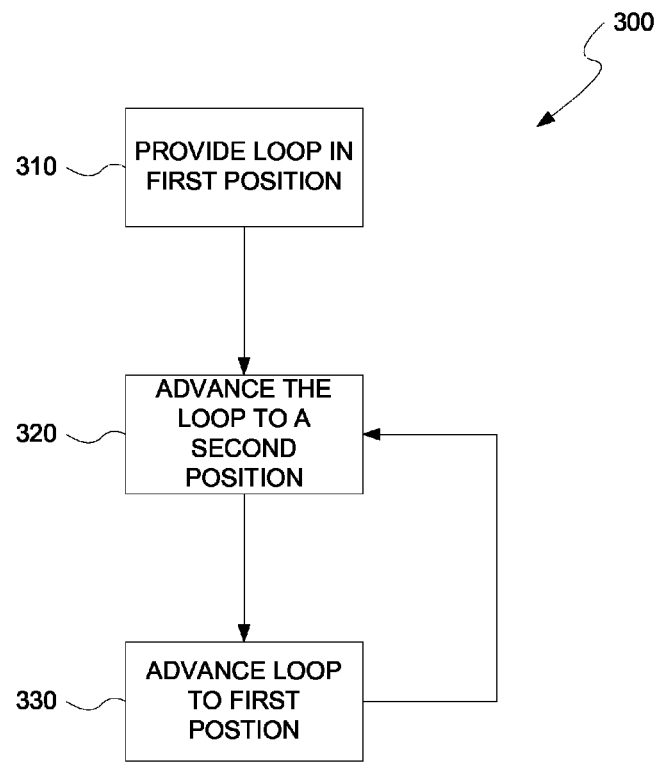
FIG. 3 depicts a flow diagram of an example method for cooling electronic devices.

Referring to FIG. 3, a flow diagram 300 of an example method for cooling electronic devices is depicted. At step 310, a loop of thermally conductive material is provided in a first position. In the first position, a first portion of the loop may be in frictional contact with the casing of an electronic device and a second portion of the loop may be located within a cooling region. At step 320, the loop is advanced to a second position. In the second position, the first portion of the loop may be located within the cooling region and the second portion of the loop may be in frictional contact with the casing. At step 330, the loop is advance to the first position again. The method may continue between steps 320 and 330 and continuously move between the first and the second position. The loop may be driven at a constant speed to advance between the first and the second position.

Figure 4:
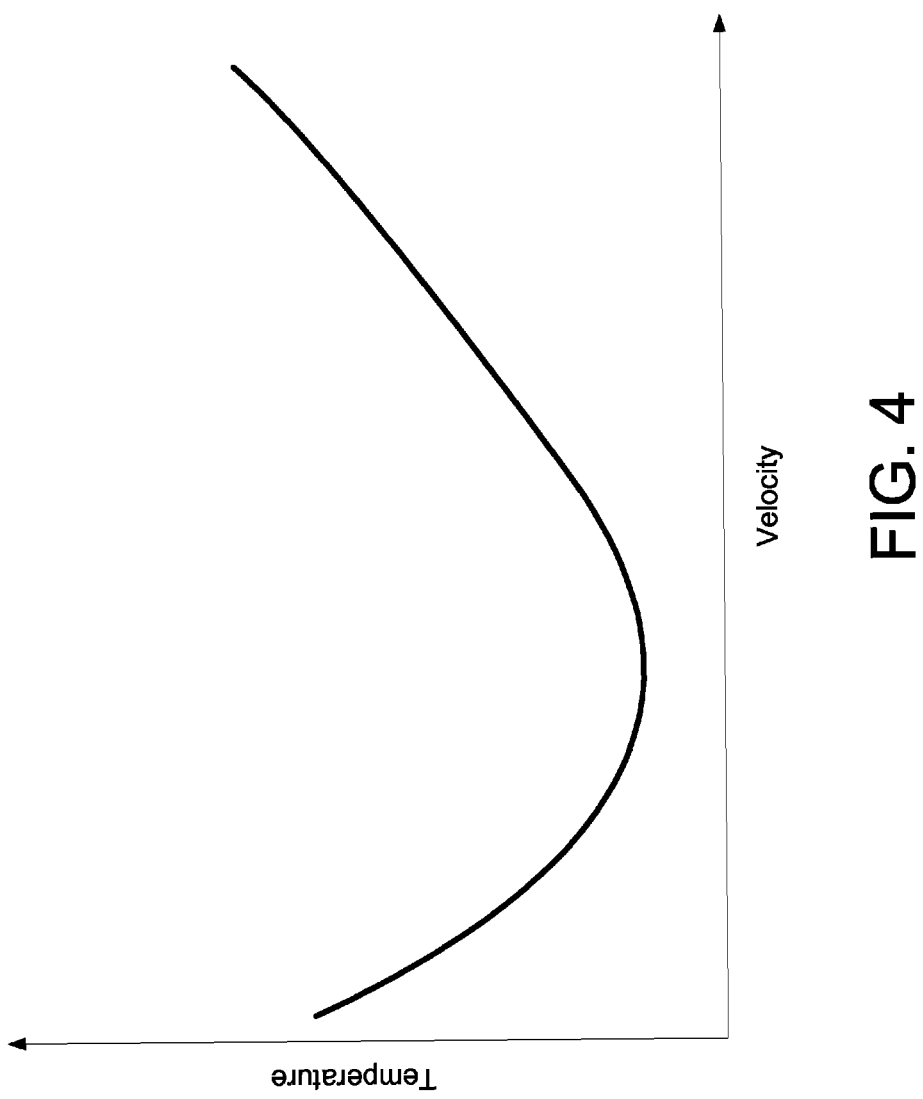
FIG. 4 depicts an example graph of the effective thermal transport based on the velocity at which a loop of conductive material slides across a casing.

Referring to FIG. 4, an example graph of the effective thermal transport based on the velocity at which a loop of conductive material slides across a casing is depicted. As shown, there may be an optimal velocity at which the loop is advanced to cool the device casing. The frictional heat produced may be greater at higher velocity. Thus, although the thermal transport may increase with velocity, the effective thermal transport may be reduced by the frictional heat generated. Eventually, increases in velocity may result in more frictional heat produced than removed through thermal transport.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for cooling a direct access storage device, the method comprising:
    providing a continuous loop of thermally conductive material in a first position, a first portion of the loop in the first position in frictional contact with a casing of the direct access storage device and a second portion of the loop in the first position located within a cooling region; and
    advancing the loop to a second position, the first portion of the loop in the second position located within the cooling region and the second portion of the loop in the second position in frictional contact with the casing of the direct access storage device.

2. The method of claim 1, wherein rolling pins support the loop.

3. The method of claim 1, wherein airflow is provided through the cooling region.

4. The method of claim 1, wherein the thermally conductive material is made of copper.

5. The method of claim 1, wherein the casing is made of steel.

6. The method of claim 1, wherein the thermally conductive material is made of copper and the casing is made of steel.

7. The method of claim 1, wherein the advancing the loop to the second position comprises:
    rotating an object in contact with the loop.

8. The method of claim 7, wherein the object is a gear and wherein the loop comprises teeth which associate with the gear.

9. The method of claim 7, wherein the object is a friction roller.

* * * * *